(12) United States Patent
Shiraki

(10) Patent No.: US 12,310,103 B2
(45) Date of Patent: May 20, 2025

(54) SEMICONDUCTOR INTEGRATED CIRCUIT DEVICE HAVING STANDARD CELLS INCLUDING THREE DIMENSIONAL TRANSISTORS

(71) Applicant: SOCIONEXT INC., Kanagawa (JP)

(72) Inventor: Yoko Shiraki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 513 days.

(21) Appl. No.: 17/347,110

(22) Filed: Jun. 14, 2021

(65) Prior Publication Data

US 2021/0305278 A1 Sep. 30, 2021

Related U.S. Application Data

(63) Continuation of application No. PCT/JP2019/049626, filed on Dec. 18, 2019.

(30) Foreign Application Priority Data

Dec. 26, 2018 (JP) ................... 2018-242901

(51) Int. Cl.
*H10D 89/10* (2025.01)
*H10D 84/90* (2025.01)
(52) U.S. Cl.
CPC ........... *H10D 84/907* (2025.01); *H10D 89/10* (2025.01); *H10D 84/912* (2025.01);
(Continued)

(58) Field of Classification Search
None
See application file for complete search history.

(56) References Cited

U.S. PATENT DOCUMENTS

2006/0289940 A1 12/2006 Hyun et al.
2010/0155783 A1* 6/2010 Law ................. H01L 27/0207
257/206
(Continued)

FOREIGN PATENT DOCUMENTS

JP 2007-013156 A 1/2007
JP 2011-049477 A 3/2011
(Continued)

OTHER PUBLICATIONS

International Search Report and Written Opinion issued in International Patent Application No. PCT/JP2019/049626, dated Mar. 10, 2020; with partial English translation.
(Continued)

*Primary Examiner* — Daniel Whalen
*Assistant Examiner* — Seyon Ali-Simah Punchbeddell
(74) *Attorney, Agent, or Firm* — Rimon P.C.

(57) ABSTRACT

A layout structure of a standard cell using a complementary FET (CFET) is provided. First and second transistors that are three-dimensional transistors lie between first and second power supply lines as viewed in plan, the second transistor being formed above the first transistor in the depth direction. A first local interconnect is connected with the source or drain of the first transistor, and a second local interconnect is connected with the source or drain of the second transistor. The first and second local interconnects extend in the Y direction, overlap each other as viewed in plan, and both overlap the first and second power supply lines as viewed in plan.

1 Claim, 16 Drawing Sheets

(52) U.S. Cl.
CPC ......... *H10D 84/941* (2025.01); *H10D 84/961* (2025.01); *H10D 84/962* (2025.01); *H10D 84/964* (2025.01); *H10D 84/981* (2025.01); *H10D 84/985* (2025.01)

(56) References Cited

U.S. PATENT DOCUMENTS

| | | |
|---|---|---|
| 2011/0049575 A1 | 3/2011 | Tanaka |
| 2012/0138886 A1 | 6/2012 | Kuhn et al. |
| 2018/0269154 A1 | 9/2018 | Kishishita |
| 2019/0155984 A1* | 5/2019 | Chen ..................... G06F 30/398 |
| 2019/0172828 A1* | 6/2019 | Smith ............... H01L 21/28088 |
| 2019/0181137 A1* | 6/2019 | Lu .................... H01L 21/76898 |
| 2019/0287897 A1* | 9/2019 | Guo .................... H01L 23/5228 |
| 2019/0371819 A1* | 12/2019 | Iwahori ........... H01L 21/823871 |
| 2020/0075489 A1* | 3/2020 | Liebmann ........... H01L 27/0688 |
| 2020/0075574 A1* | 3/2020 | Smith .................. H01L 29/0692 |
| 2020/0135718 A1* | 4/2020 | Liebmann .............. H10B 10/18 |
| 2021/0066508 A1 | 3/2021 | Shimbo |
| 2021/0104552 A1 | 4/2021 | Shimbo |

FOREIGN PATENT DOCUMENTS

| | | | |
|---|---|---|---|
| JP | 2014-505995 A | 3/2014 | |
| WO | 2017/090389 A1 | 6/2017 | |
| WO | 2018/025580 A1 | 2/2018 | |
| WO | 2018/025597 A1 | 2/2018 | |
| WO | WO-2018150913 A1 * | 8/2018 | ............ B21J 15/323 |

OTHER PUBLICATIONS

Ryckaert J. et al., "The Complementary FET (CFET) for CMOS scaling beyond N3", 2018 Symposium on VLSI Technology Digest of Technical Papers, pp. 141-142.

A. Mocuta et al., "Enabling CMOS Scaling Towards 3nm and Beyond", 2018 Symposium on VLSI Technology Digest of Technical Papers, pp. 147-148.

* cited by examiner

FIG.1A
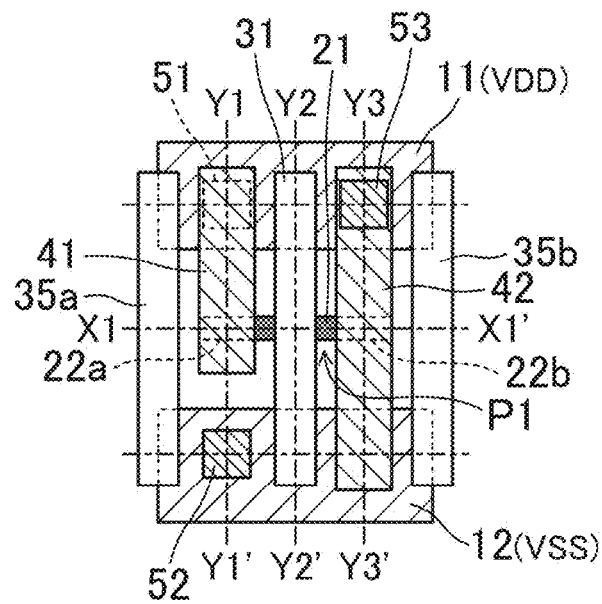
LOWER PART(Pch)
FIG.1B
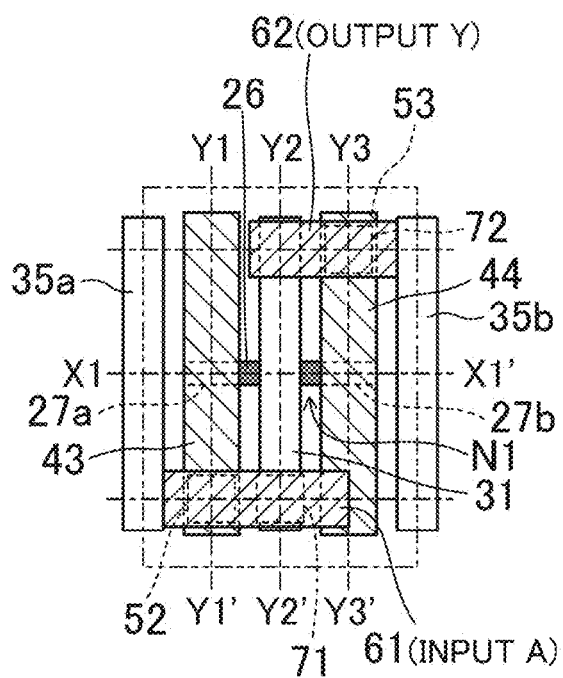
UPPER PART(Nch)
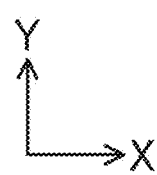
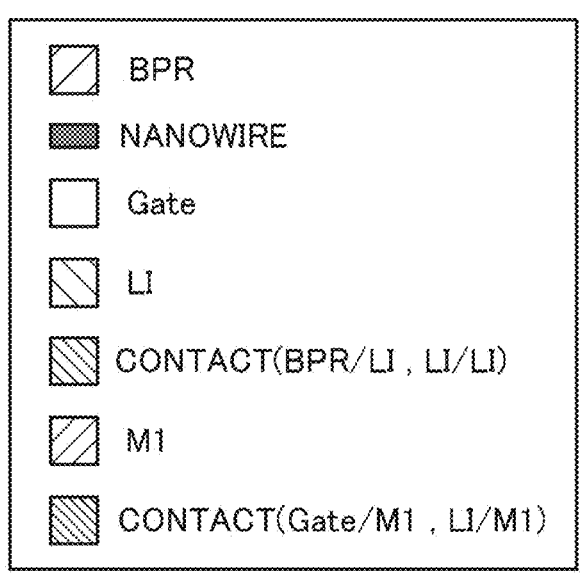

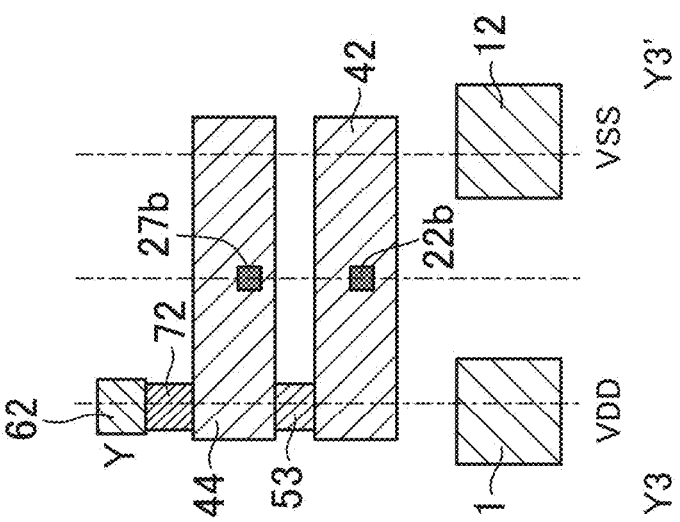
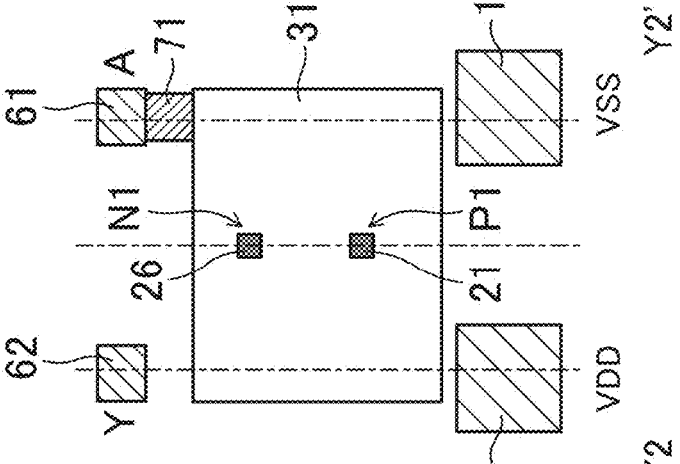
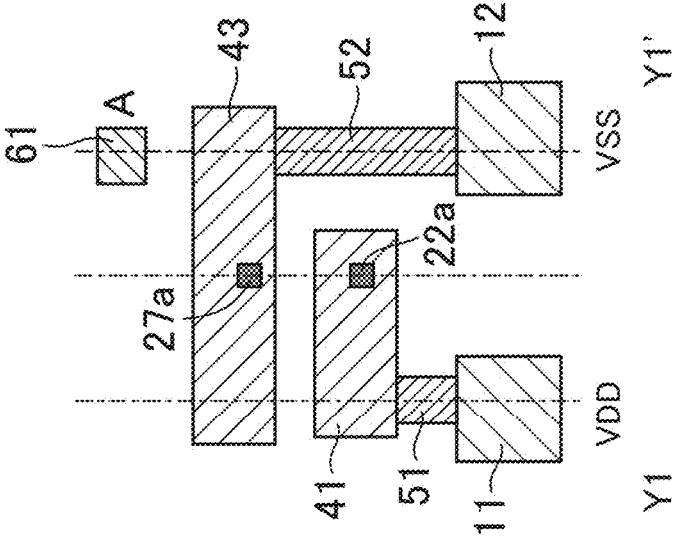

SEMICONDUCTOR INTEGRATED CIRCUIT DEVICE HAVING STANDARD CELLS INCLUDING THREE DIMENSIONAL TRANSISTORS

CROSS-REFERENCE TO RELATED APPLICATIONS

This is a continuation of International Application No. PCT/JP2019/049626 filed on Dec. 18, 2019, which claims priority to Japanese Patent Application No. 2018-242901 filed on Dec. 26, 2018. The entire disclosures of these applications are incorporated by reference herein.

BACKGROUND

The present disclosure relates to a semiconductor integrated circuit device provided with standard cells including three-dimensional transistors.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

A three-dimensional device in which three-dimensional p-type FET and n-type FET are stacked vertically to a substrate is herein called a complementary FET (CFET) following the cited paper by Ryckaert J. et al. Also, the direction vertical to the substrate is herein called the depth direction.

In fine processes, the finishing of a layout pattern is influenced by unevenness in the density of the layout pattern and surrounding pattern shapes. If the finishing of a layout pattern varies, there will occur problems such as variations in performance, degradation in reliability, and decrease in yield in the semiconductor integrated circuit. Also, if the surrounding pattern shapes are not fixed, the predictability of the performance of the semiconductor integrated circuit will decrease.

An objective of the present disclosure is providing a layout structure, for a standard cell using a CFET, capable of preventing or reducing variations in layout pattern shape and also improving the predictability of the performance of a semiconductor integrated circuit.

SUMMARY

In the first mode of the present disclosure, a semiconductor integrated circuit device including a standard cell is provided. The standard cell includes: a first power supply line extending in a first direction and supplying a first power supply voltage; a second power supply line extending in the first direction and supplying a second power supply voltage different from the first power supply voltage; a first transistor that is a three-dimensional transistor of a first conductivity type lying between the first power supply line and the second power supply line as viewed in plan; a second transistor that is a three-dimensional transistor of a second conductivity type, formed above the first transistor in a depth direction, lying between the first power supply line and the second power supply line as viewed in plan; a first local interconnect extending in a second direction that is a direction perpendicular to the first direction, connected with a source or drain of the first transistor; and a second local interconnect extending in the second direction and overlapping the first local interconnect as viewed in plan, connected with a source or drain of the second transistor, wherein both the first and second local interconnects overlap the first and second power supply lines as viewed in plan.

According to the above mode, the standard cell includes a first transistor that is a three-dimensional transistor of a first conductivity type and a second transistor that is a three-dimensional transistor of a second conductivity type, lying between a first power supply line and a second power supply line as viewed in plan. The second transistor is formed above the first transistor in the depth direction. A first local interconnect is connected with the source or drain of the first transistor, and a second local interconnect is connected with the source or drain of the second transistor. The first and second local interconnects extend in a second direction perpendicular to a first direction in which the first and second power supply lines extend, and overlap each other as viewed in plan. Both the first and second local interconnects overlap the first and second power supply lines as viewed in plan. That is, the first and second local interconnects have redundant portions unnecessary for constituting the logical function. With these portions, the density unevenness of the local interconnects in the semiconductor integrated circuit device is reduced, and also variations in wiring pattern shapes around the first and second local interconnects are reduced. It is therefore possible to prevent or reduce variations in performance, degradation in reliability, and decrease in yield in the semiconductor integrated circuit and also improve the predictability of the performance of the semiconductor integrated circuit.

In the second mode of the present disclosure, a semiconductor integrated circuit device including a standard cell is provided. The standard cell includes: a first power supply line extending in a first direction and supplying a first power supply voltage; a second power supply line extending in the first direction and supplying the first power supply voltage: a third power supply line extending in the first direction between the first power supply line and the second power supply line and supplying a second power supply voltage different from the first power supply voltage; a first transistor that is a three-dimensional transistor of a first conductivity type lying between the first power supply line and the third power supply line as viewed in plan; a second transistor that is a three-dimensional transistor of a second conductivity type, formed above the first transistor in a depth direction, lying between the first power supply line and the third power supply line as viewed in plan: a first local interconnect extending in a second direction that is a direction perpendicular to the first direction, connected with a source or drain of the first transistor; and a second local interconnect extending in the second direction and overlapping the first local interconnect as viewed in plan, connected with a source or drain of the second transistor, wherein at least one of the first and second local interconnects overlaps the first, second, and third power supply lines as viewed in plan.

According to the above mode, the standard cell includes a first transistor that is a three-dimensional transistor of a first conductivity type and a second transistor that is a three-dimensional transistor of a second conductivity type, lying between a first power supply line and a third power supply line as viewed in plan. The second transistor is formed above the first transistor in the depth direction. A first local interconnect is connected with the source or drain of the first transistor, and a second local interconnect is connected with the source or drain of the second transistor. The first and second local interconnects extend in a second direction perpendicular to a first direction in which the first, second, and third power supply lines extend, and overlap each other as viewed in plan. At least one of the first and second local interconnects overlaps the first, second, and third power supply lines as viewed in plan. That is, at least one of the first and second local interconnects has a redundant portion unnecessary for constituting the logical function. With this portion, the density unevenness of the local interconnects in the semiconductor integrated circuit device is reduced, and also variations in wiring pattern shapes around the first and second local interconnects are reduced. It is therefore possible to prevent or reduce variations in performance, degradation in reliability, and decrease in yield in the semiconductor integrated circuit and also improve the predictability of the performance of the semiconductor integrated circuit.

In the third mode of the present disclosure, a semiconductor integrated circuit device including a first standard cell and a second standard cell placed adjacent to the first standard cell in a first direction is provided. The first standard cell includes: a first power supply line extending in the first direction and supplying a first power supply voltage; a second power supply line extending in the first direction and supplying a second power supply voltage different from the first power supply voltage; a first transistor that is a three-dimensional transistor of a first conductivity type lying between the first power supply line and the second power supply line as viewed in plan; and a second transistor that is a three-dimensional transistor of a second conductivity type, formed above the first transistor in a depth direction, lying between the first power supply line and the second power supply line as viewed in plan, the second standard cell including: a third power supply line extending in the first direction and supplying the first power supply voltage; a fourth power supply line extending in the first direction and supplying the second power supply voltage: a third transistor that is a three-dimensional transistor of the first conductivity type lying between the third power supply line and the fourth power supply line as viewed in plan; and a fourth transistor that is a three-dimensional transistor of the second conductivity type, formed above the third transistor in the depth direction, lying between the third power supply line and the fourth power supply line as viewed in plan, wherein the first transistor and the third transistor face each other, and the second transistor and the fourth transistor face each other, across a cell boundary that is a boundary between the first standard cell and the second standard cell, the first standard cell further includes: a first local interconnect extending in a second direction that is a direction perpendicular to the first direction, connected with a source or drain of the first transistor whichever is closer to the cell boundary; and a second local interconnect extending in the second direction and overlapping the first local interconnect as viewed in plan, connected with a source or drain of the second transistor whichever is closer to the cell boundary, and both the first and second local interconnects overlap the first and second power supply lines as viewed in plan.

According to the above mode, the first standard cell includes a first transistor that is a three-dimensional transistor of a first conductivity type and a second transistor that is a three-dimensional transistor of a second conductivity type, lying between a first power supply line and a second power supply line as viewed in plan. The second transistor is formed above the first transistor in the depth direction. The second standard cell includes a third transistor that is a three-dimensional transistor of the first conductivity type and a fourth transistor that is a three-dimensional transistor of the second conductivity type, lying between a third power supply line and a fourth power supply line as viewed in plan. The fourth transistor is formed above the third transistor in the depth direction. The first transistor and the third transistor face each other, and the second transistor and the fourth transistor face each other, across the cell boundary between the first and second standard cells. A first local interconnect is connected with the source or drain of the first transistor whichever is closer to the cell boundary, and a second local interconnect is connected with the source or drain of the second transistor whichever is closer to the cell boundary. The first and second local interconnects extend in a second direction perpendicular to a first direction in which the first and second power supply lines extend, and overlap each other as viewed in plan. Both the first and second local interconnects overlap the first and second power supply lines as viewed in plan. Therefore, the first and second local interconnects have redundant portions unnecessary for constituting the logical function. This enhances the predictability of finished dimensions of local interconnects in the second standard cell, whereby the predictability of the performance of the semiconductor integrated circuit can be improved.

According to the present disclosure, in a semiconductor integrated circuit device including a standard cell using a CFET, it is possible to prevent or reduce variations in performance, degradation in reliability, and decrease in yield and also improve the predictability of the performance.

BRIEF DESCRIPTION OF THE DRAWINGS

FIGS. 1A and 1B are plan views showing an example of the layout structure of a standard cell according to the first embodiment.

FIGS. 3A to 3C are cross-sectional views of the layout structure of FIGS. 1A and 1B taken in the vertical direction as viewed in plan.

DETAILED DESCRIPTION

Embodiments of the present disclosure will be described hereinafter with reference to the accompanying drawings. In the following embodiments, a semiconductor integrated circuit device includes a plurality of standard cells (herein simply called cells as appropriate), and at least some of the plurality of standard cells include a CFET, that is, a three-dimensional device in which three-dimensional p-type FET and n-type FET are stacked vertically to a substrate.

Figure 13:
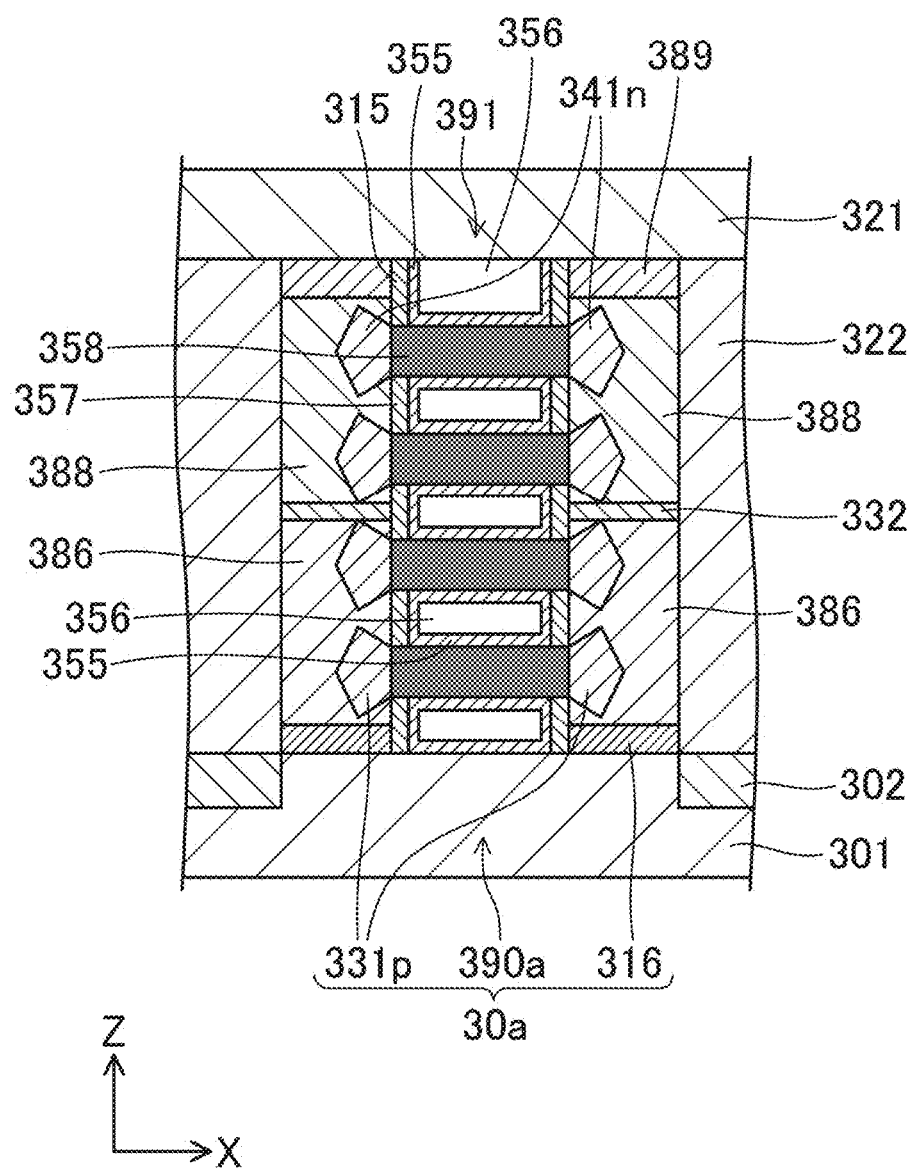
FIG. 13 is a cross-sectional view showing a structure of a semiconductor device provided with a CFET.
Figure 14:
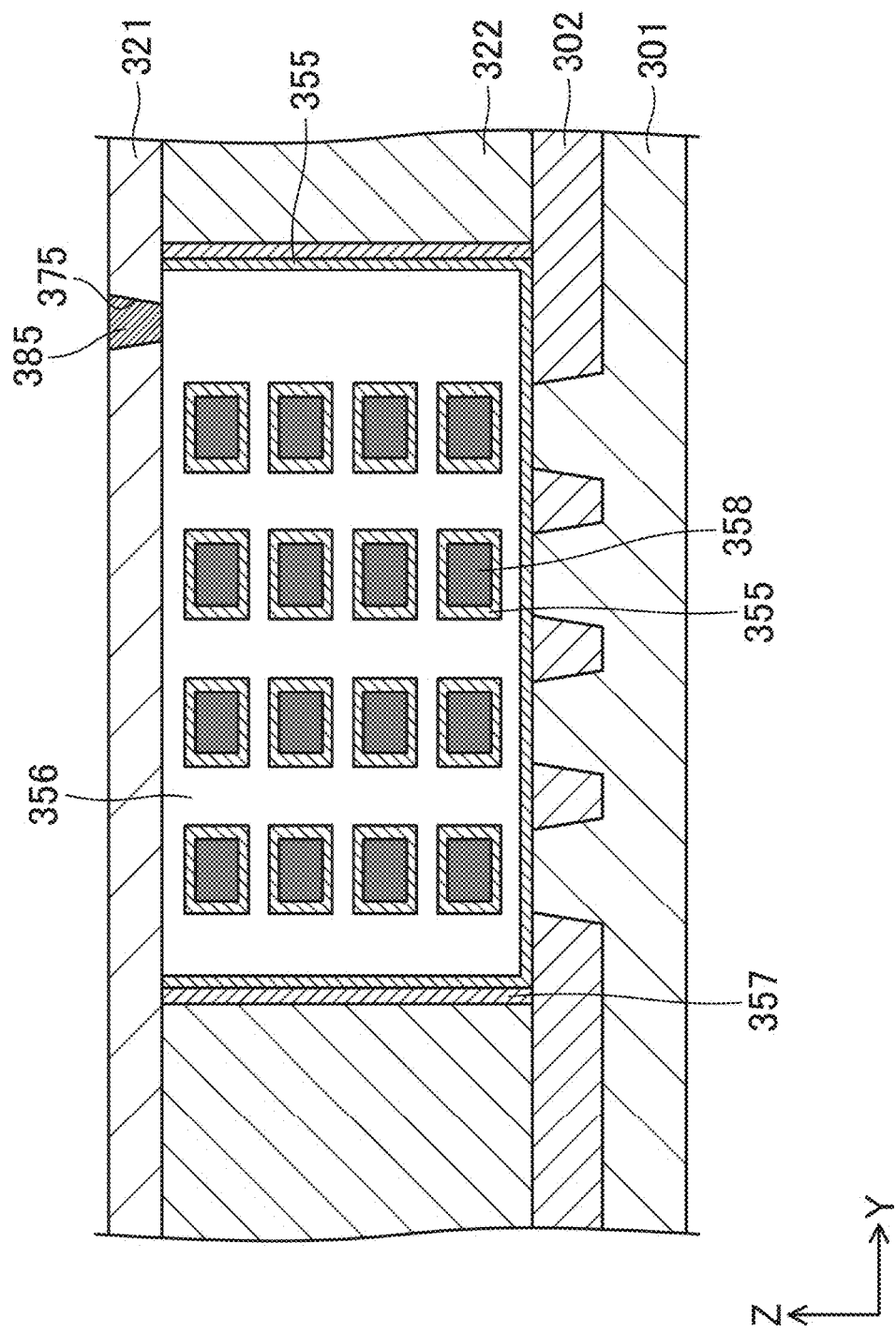
FIG. 14 is a cross-sectional view showing the structure of the semiconductor device provided with a CFET.
Figure 15:
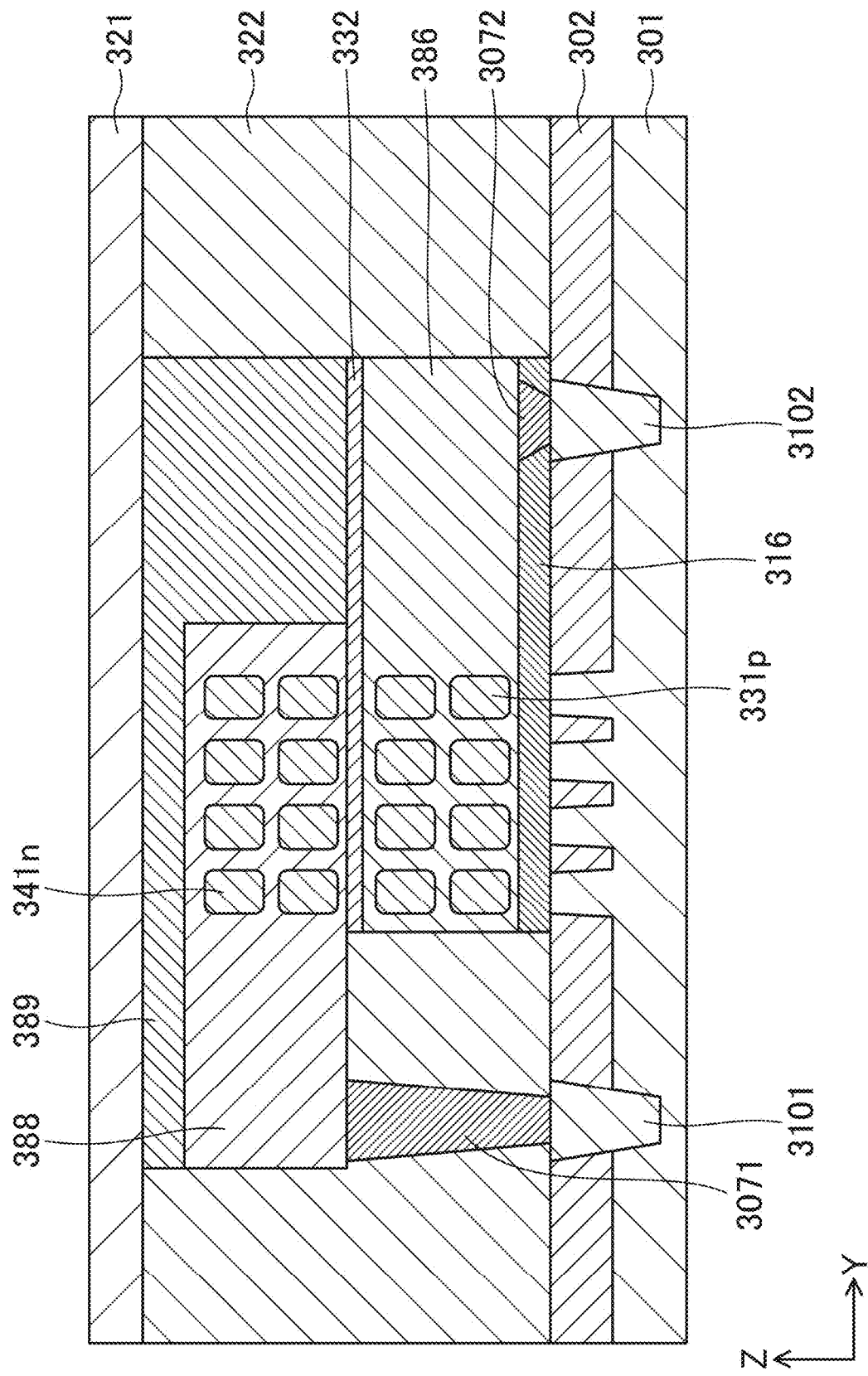
FIG. 15 is a cross-sectional view showing the structure of the semiconductor device provided with a CFET.
Figure 16:
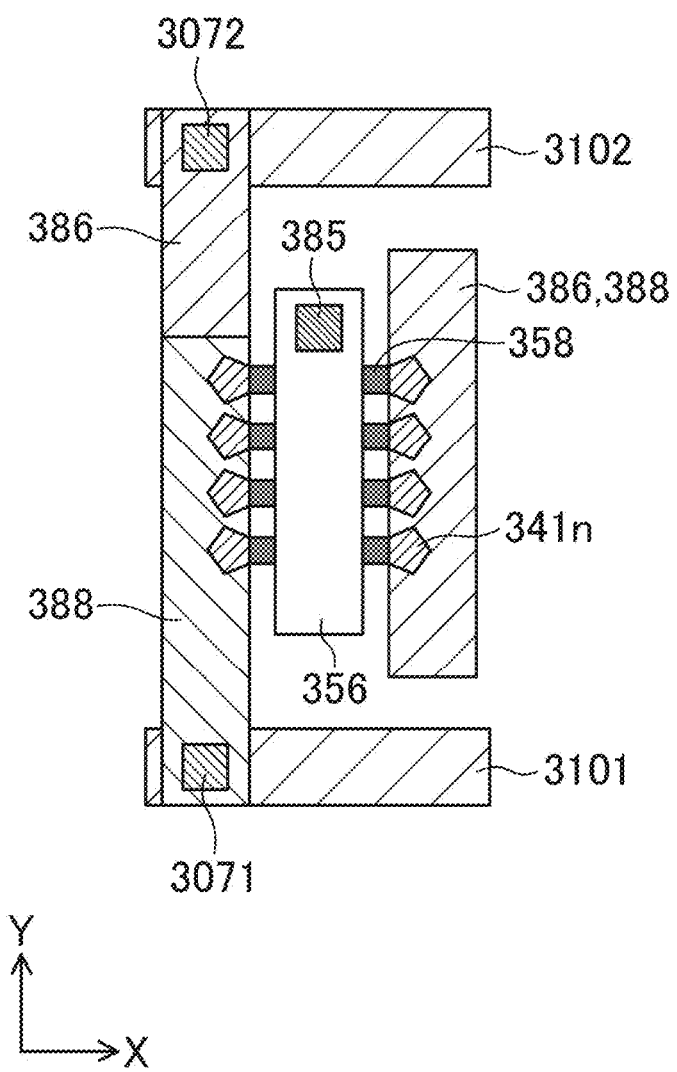
FIG. 16 is a plan view showing the structure of the semiconductor device provided with a CFET.

First, the basic structure of the CFET will be described. FIGS. 13 to 16 are views showing a structure of a semiconductor device provided with a CFET, where FIG. 13 is a cross-sectional view taken in an X direction, FIG. 14 is a cross-sectional view of a gate portion taken in a Y direction, FIG. 15 is a cross-sectional view of a source/drain portion taken in the Y direction, and FIG. 16 is a plan view. Note that the X direction refers to the direction in which nanowires extend, the Y direction refers to the direction in which a gate extends, and a Z direction refers to the direction vertical to the substrate plane. Note also that FIGS. 13 to 16 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 14, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 15, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

A semiconductor layer portion formed on each end of a nanowire to constitute a terminal that is to be the source or drain of a transistor is herein called a "pad." In the illustrated example of the basic structure of the CFET, the p-type semiconductor layers 331*p* and the n-type semiconductor layers 341*n* correspond to pads.

Note that, in the plan views and cross-sectional views in the following embodiments, illustration of various insulating films may be omitted in some cases. Also, nanowires and pads on both ends of the nanowires may be illustrated in simplified linear shapes in some cases. Also, as used herein, an expression indicating that sizes, etc. are identical, such as the "same size," is to be understood as including a range of manufacturing variations.

First Embodiment

Figure 2:
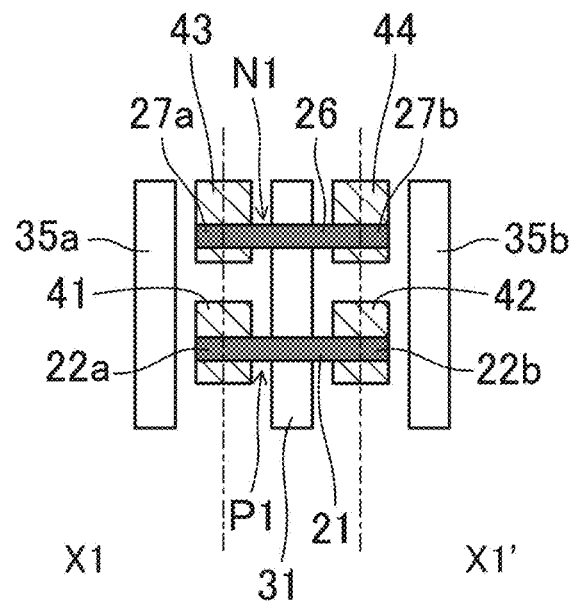
FIG. 2 is a cross-sectional view of the layout structure of FIGS. 1A and 1B taken in the horizontal direction as viewed in plan.

FIGS. 1A, 1B, 2, and 3A to 3C are views showing an example of the layout structure of a cell according to the first embodiment, where FIGS. 1A and 1B are plan views, FIG. 2 is a cross-sectional view taken in the horizontal direction as viewed in plan, and FIGS. 3A to 3C are cross-sectional views taken in the vertical direction as viewed in plan. Specifically. FIG. 1A shows a lower part, i.e., a portion including a three-dimensional transistor formed closer to a substrate (a p-type nanowire FET in the illustrated example), and FIG. 1B shows an upper part, i.e., a portion including a three-dimensional transistor formed away from the substrate (an n-type nanowire FET in the illustrated example). FIG. 2 shows a cross section taken along line X1-X1', FIG. 3A shows a cross section taken along line Y1-Y1, FIG. 3B shows a cross section taken along line Y2-Y2', and FIG. 3C shows a cross section taken along line Y3-Y3'.

Figure 4:
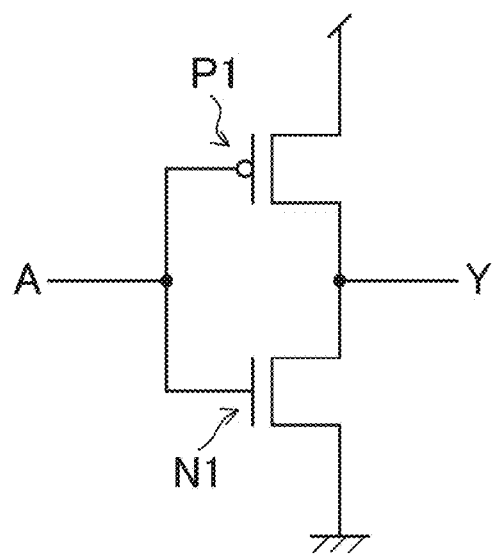
FIG. 4 is a circuit diagram of the standard cell of FIGS. 1A and 1B.

FIG. 4 is a circuit diagram of the cell shown in FIGS. 1A, 1B, 2, and 3A to 3C.

As shown in FIG. 4, the cell includes a p-type transistor P1 and an n-type transistor N1, implementing an inverter circuit having an input A and an output Y.

In the following description, in the plan views such as FIGS. 1A and 1B, the horizontal direction in the figure is called the X direction (corresponding to the first direction), and the vertical direction in the figure is called the Y direction (corresponding to the second direction). The direction vertical to the substrate plane is called the Z direction (corresponding to the depth direction). Also, the dashed lines running horizontally and vertically in the plan views such as FIGS. 1A and 1B and the dashed lines running vertically in the cross-sectional views such as FIG. 2 represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

As shown in FIG. 1A, power supply lines 11 and 12 extending in the X direction are provided on both ends of the cell in the Y direction. The power supply lines 11 and 12 are both buried power rails (BPR) formed in a buried wiring layer. The power supply line 11 supplies a power supply voltage VDD and the power supply line 12 supplies a power supply voltage VSS.

Interconnects 61 and 62 extending in the X direction are formed in an M1 wiring layer: the interconnect 61 corresponds to the input A and the interconnect 62 corresponds to the output Y.

A nanowire 21 extending in the X direction is formed in the lower part of the cell, and a nanowire 26 extending in the X direction is formed in the upper part of the cell. The nanowires 21 and 26 overlap each other as viewed in plan. Pads 22*a* and 22*b* doped with a p-type semiconductor are formed at both ends of the nanowire 21, and pads 27*a* and 27*b* doped with an n-type semiconductor are formed at both ends of the nanowire 26. The nanowire 21 constitutes the channel portion of the p-type transistor P1, and each of the pads 22*a* and 22*b* constitutes a terminal that is to be the source or drain of the p-type transistor P1. The nanowire 26 constitutes the channel portion of the n-type transistor N1, and each of the pads 27*a* and 27*b* constitutes a terminal that is to be the source or drain of the n-type transistor N1. The p-type transistor P1 is formed above the buried wiring layer in the Z direction, and the n-type transistor N1 is formed above the p-type transistor P1 in the Z direction.

A gate interconnect 31 extends in the Y direction roughly in the center of the cell in the X direction and also extends in the Z direction over the lower and upper parts of the cell. The gate interconnect 31 is to be the gates of the p-type transistor P1 and the n-type transistor N1. That is, the p-type transistor P1 is constituted by the nanowire 21, the gate interconnect 31, and the pads 22*a* and 22*b*, and the n-type transistor N1 is constituted by the nanowire 26, the gate interconnect 31, and the pads 27*a* and 27*b*. Also, dummy gate interconnects 35*a* and 35*b* are formed on both ends of the cell in the X direction. Like the gate interconnect 31, the dummy gate interconnects 35*a* and 35*b* extend in the Y and Z directions.

In the lower part of the cell, local interconnects 41 and 42 are formed to extend in the Y direction. The local interconnect 41 is connected with the pad 22*a*, and the local interconnect 42 is connected with the pad 22*b*. In the upper part of the cell, local interconnects 43 and 44 are formed to extend in the Y direction. The local interconnect 43 is connected with the pad 27*a*, and the local interconnect 44 is connected with the pad 27*b*.

The local interconnect 41 extends up to a position overlapping the power supply line 11 as viewed in plan and is connected with the power supply line 11 through a contact 51. The contact 51 is formed at a position where the power supply line 11 and the local interconnect 41 overlap each other as viewed in plan. The local interconnect 43 extends up to a position overlapping the power supply line 12 as viewed in plan and is connected with the power supply line 12 through a contact 52. The contact 52 is formed at a position where the power supply line 12 and the local interconnect 43 overlap each other as viewed in plan. The local interconnects 42 and 44 are mutually connected through a contact 53. The contact 53 is formed at a position where the local interconnects 42 and 44 overlap each other as viewed in plan.

The interconnect 61 is connected with the gate interconnect 31 through a contact 71. The interconnect 62 is connected with the local interconnect 44 through a contact 72.

In the layout structure of the cell according to this embodiment, the local interconnects have redundant portions unnecessary for constituting the logical function. With these portions, the density unevenness of the local interconnects in the semiconductor integrated circuit device is reduced, and also variations in wiring pattern shapes around the local interconnects are reduced.

Specifically, the local interconnects 42, 43, and 44 extend up to positions overlapping both the power supply lines 11 and 12 as viewed in plan. While the local interconnects 42 and 44 are mutually connected through the contact 53, they are electrically isolated from the power supply lines 11 and 12. The local interconnects 42 and 44 overlapping each other as viewed in plan have the same length and are aligned at both ends in the Y direction.

That is, the local interconnect 42 is an interconnect for connecting the drain of the transistor P1 to the output Y, and the local interconnect 44 is an interconnect for connecting the drain of the transistor N1 to the output Y. It is therefore only necessary to form the local interconnects 42 and 44 to be connectable to the M1 interconnect 62 that is to be the output Y, and unnecessary to extend them up to positions overlapping the power supply line 12 as viewed in plan. In this embodiment, however, the local interconnects 42 and 44 are extended downward in the Y direction to overlap the power supply line 12 as viewed in plan.

Also, the local interconnect 43 is an interconnect for supplying the power supply voltage VSS to the source of the transistor N1. It is therefore only necessary to form the local interconnect 43 to be connectable to the power supply line 12, and unnecessary to extend it up to a position overlapping the power supply line 11 as viewed in plan. In this embodiment, however, the local interconnect 43 is extended upward in the Y direction to overlap the power supply line 11 as viewed in plan.

As described above, according to this embodiment, the local interconnect 42 and the local interconnect 44 extend in the Y direction and overlap each other as viewed in plan. Both the local interconnects 42 and 44 overlap the power supply lines 11 and 12 as viewed in plan. That is, the local interconnects 42 and 44 have redundant portions unnecessary for constituting the logical function. With these portions, the density unevenness of the local interconnects in the semiconductor integrated circuit device is reduced, and also variations in wiring pattern shapes around the local interconnects 42 and 44 are reduced. It is therefore possible to prevent or reduce variations in performance, degradation in reliability, and decrease in yield in the semiconductor integrated circuit and also improve the predictability of the performance of the semiconductor integrated circuit.

While the local interconnects 42 and 44 overlapping each other as viewed in plan have the same length and are aligned at both ends in the Y direction, they are not necessarily required to have the same length and aligned ends.

(Other Examples: No. 1)

Figure 5:
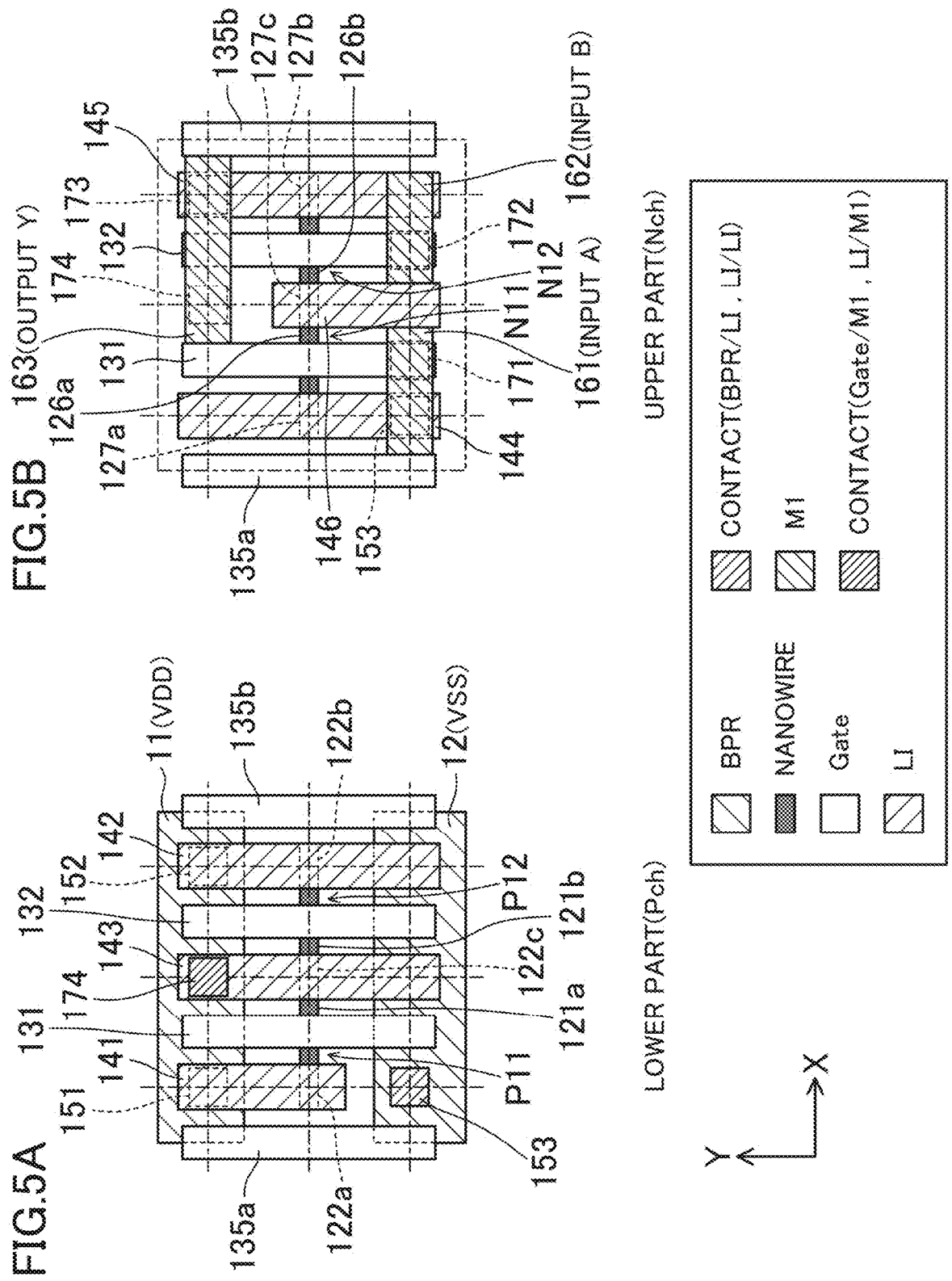
FIGS. 5A and 5B are plan views showing another example of the layout structure of the standard cell according to the first embodiment.
Figure 6:
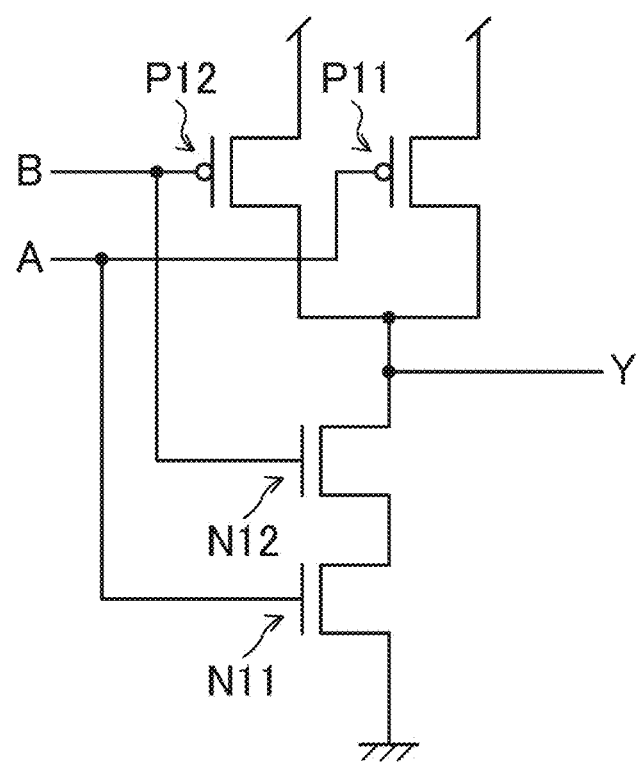
FIG. 6 is a circuit diagram of the standard cell of FIGS. 5A and 5B.

FIGS. 5A and 5B are plan views showing another example of the layout structure of the cell according to the first embodiment, where FIG. 5A shows a lower part including p-type nanowire FETs and FIG. 5B shows an upper part including n-type nanowire FETs. FIG. 6 is a circuit diagram of the cell shown in FIGS. 5A and 5B. As shown in FIG. 6, the cell includes p-type transistors P11 and P12 and n-type transistors N11 and N12, implementing a 2-input NAND circuit having inputs A and B and an output Y. Note that the cross-sectional structure of the cell will be understandable by referring to FIGS. 2 and 3A-3C shown in the first embodiment.

Interconnects 161, 162, and 163 extending in the X direction are formed in an M1 wiring layer: the interconnect 161 corresponds to the input A, the interconnect 162 corresponds to the input B, and the interconnect 163 corresponds to the output Y.

Nanowires 121a and 121b extending in the X direction are formed in the lower part of the cell, and nanowires 126a and 126b extending in the X direction are formed in the upper part of the cell. A pad 122a doped with a p-type semiconductor is formed on the left of the nanowire 121a as viewed in the figure, and a pad 122b doped with a p-type semiconductor is formed on the right of the nanowire 121b as viewed in the figure. Also, a pad 122c doped with a p-type semiconductor is formed between the nanowires 121a and 121b. A pad 127a doped with an n-type semiconductor is formed on the left of the nanowire 126a as viewed in the figure, and a pad 127b doped with an n-type semiconductor is formed on the right of the nanowire 126b as viewed in the figure. Also, a pad 127c doped with an n-type semiconductor is formed between the nanowires 126a and 126b.

Gate interconnects 131 and 132 extend in the Y direction and also extend in the Z direction over the lower and upper parts of the cell. The gate interconnect 131 is to be the gates of the p-type transistor P11 and the n-type transistor N11, and the gate interconnect 132 is to be the gates of the p-type transistor P12 and the n-type transistor N12. Also, dummy gate interconnects 135a and 135b are formed on both ends of the cell in the X direction. Like the gate interconnects 131 and 132, the dummy gate interconnects 135a and 135b extend in the Y and Z directions.

In the lower part of the cell, local interconnects 141, 142, and 143 are formed to extend in the Y direction. The local interconnect 141 is connected with the pad 122a, the local interconnect 142 is connected with the pad 122b, and the local interconnect 143 is connected with the pad 122c. In the upper part of the cell, local interconnects 144, 145, and 146 are formed to extend in the Y direction. The local interconnect 144 is connected with the pad 127a, the local interconnect 145 is connected with the pad 127b, and the local interconnect 146 is connected with the pad 127c.

The local interconnect 141 extends up to a position overlapping the power supply line 11 as viewed in plan and is connected with the power supply line 11 through a contact 151. The local interconnect 142 extends up to a position overlapping the power supply line 11 as viewed in plan and is connected with the power supply line 11 through a contact 152. The local interconnect 144 extends up to a position overlapping the power supply line 12 as viewed in plan and is connected with the power supply line 12 through a contact 153.

The interconnect 161 is connected with the gate interconnect 131 through a contact 171, and the interconnect 162 is connected with the gate interconnect 132 through a contact 172. The interconnect 163 is connected with the local interconnect 145 through a contact 173 and also connected with the local interconnect 143 through a contact 174.

In the layout structure of the cell in this example, also, the local interconnects have redundant portions unnecessary for constituting the logical function. With these portions, the density unevenness of the local interconnects in the semiconductor integrated circuit device is reduced, and also variations in wiring pattern shapes around the local interconnects are reduced.

Specifically, the local interconnects 142, 143, 144, and 145 extend up to positions overlapping both the power supply lines 11 and 12 as viewed in plan. The local interconnects 142 and 145 overlapping each other as viewed in plan have the same length and are aligned at both ends in the Y direction. Also, the local interconnect 146 extends up to a position overlapping the power supply line 12 as viewed in plan.

That is, the local interconnect 142 is an interconnect for supplying the power supply voltage VDD to the source of the transistor P12. It is therefore only necessary to form the local interconnect 142 to be connectable with the power supply line 11, and unnecessary to extend it up to a position overlapping the power supply line 12 as viewed in plan. Also, the local interconnect 143 is an interconnect for connecting the drains of the transistors P11 and P12 to the output Y. It is therefore only necessary to form the local interconnect 143 to be connectable to the M1 interconnect 163 that is to be the output Y. and unnecessary to extend it up to a position overlapping the power supply line 12 as viewed in plan. In this example, however, the local interconnects 142 and 143 are extended downward in the Y direction to overlap the power supply line 12 as viewed in plan.

Also, the local interconnect 144 is an interconnect for supplying the power supply voltage VSS to the source of the transistor N11. It is therefore only necessary to form the local interconnect 144 to be connectable with the power supply line 12, and unnecessary to extend it up to a position overlapping the power supply line 11 as viewed in plan. In this example, however, the local interconnect 144 is extended upward in the Y direction to overlap the power supply line 11 as viewed in plan.

Further, the local interconnect 145 is an interconnect for connecting the drain of the transistor N12 to the output Y. It is therefore only necessary to form the local interconnect 145 to be connectable to the M1 interconnect 163 that is to be the output Y. and unnecessary to extend it up to a position overlapping the power supply line 12 as viewed in plan. Also, the local interconnect 146 is an interconnect that is to be a connection node of the transistors N11 and N12. As is found from the circuit diagram of FIG. 6, the connection node of the transistors N11 and N12 is not connected with any other interconnect. Therefore, the local interconnect 146 does not need to be extended up to a position overlapping the power supply line 12 as viewed in plan. In this embodiment, however, the local interconnects 145 and 146 are extended downward in the Y direction to overlap the power supply line 12 as viewed in plan.

As described above, according to this example, the local interconnect 142 and the local interconnect 145 extend in the Y direction and overlap each other as viewed in plan. Both the local interconnects 142 and 145 overlap the power supply lines 11 and 12 as viewed in plan. That is, the local interconnects 142 and 145 have redundant portions unnecessary for constituting the logical function. With these portions, the density unevenness of the local interconnects in the semiconductor integrated circuit device is reduced, and also variations in wiring pattern shapes around the local interconnects 142 and 145 are reduced. It is therefore possible to prevent or reduce variations in performance, degradation in reliability, and decrease in yield in the semiconductor integrated circuit and also improve the predictability of the performance of the semiconductor integrated circuit.

Also, the local interconnect 146 that is to be the connection node of the transistors N11 and N12 and is not connected with any other interconnect has a redundant portion. This further reduces the density unevenness of the local interconnects in the semiconductor integrated circuit device and also further reduces variations in wiring pattern shapes around the local interconnect 146.

Note that the local interconnects 142 and 145 overlapping each other as viewed in plan are not necessarily required to have the same length and aligned ends in the Y direction.

(Other Examples: No. 2)

Figure 7:
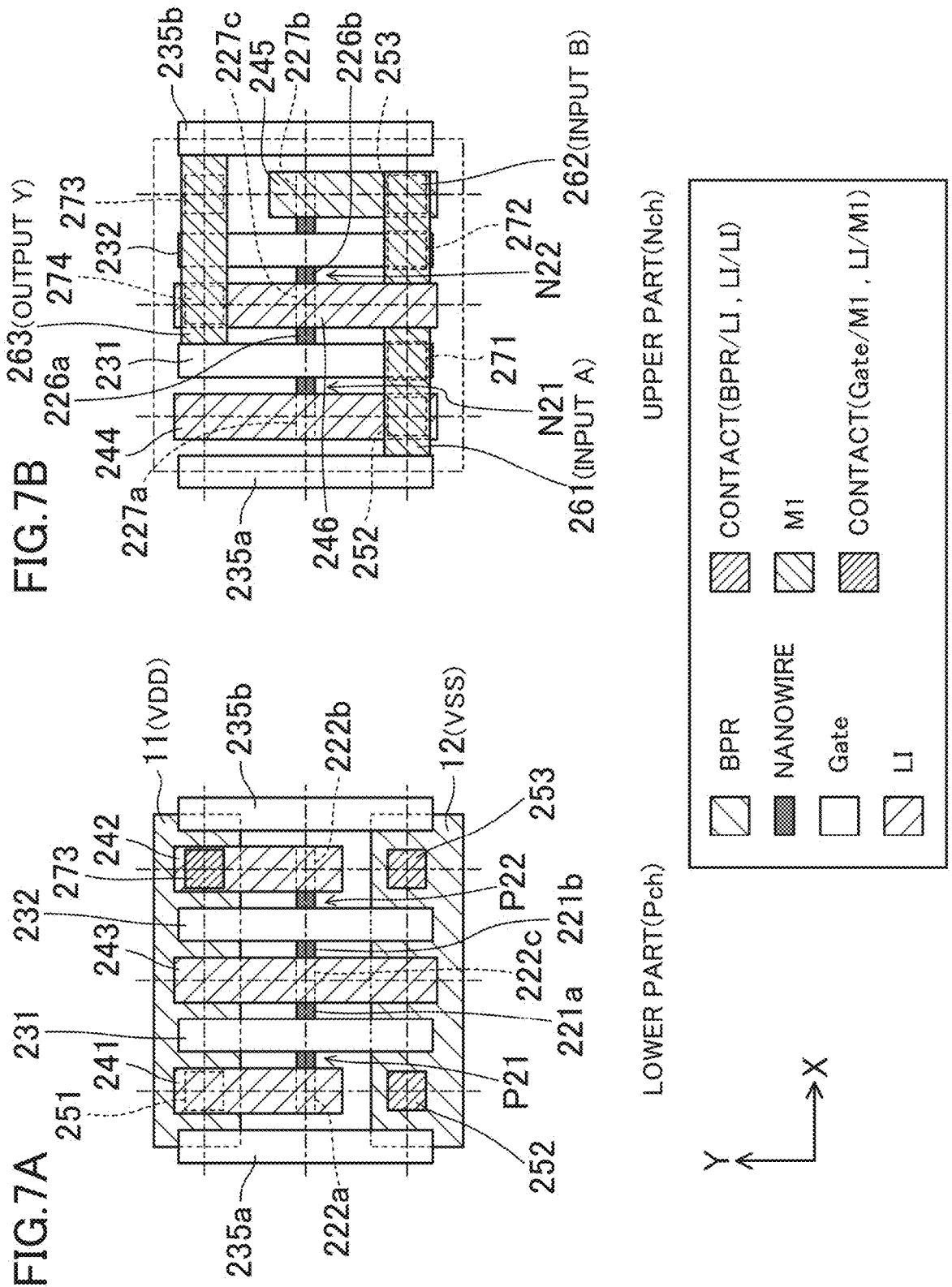
FIGS. 7A and 7B are plan views showing yet another example of the layout structure of the standard cell according to the first embodiment.
Figure 8:
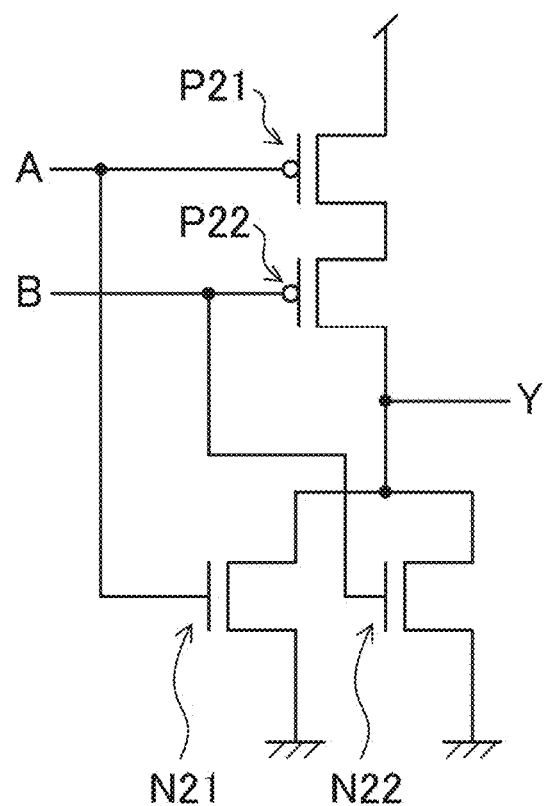
FIG. 8 is a circuit diagram of the standard cell of FIGS. 7A and 7B.

FIGS. 7A and 7B are plan views showing yet another example of the layout structure of the cell according to the first embodiment, where FIG. 7A shows a lower part including p-type nanowire FETs and FIG. 7B shows an upper part including n-type nanowire FETs. FIG. 8 is a circuit diagram of the cell shown in FIGS. 7A and 7B. As shown in FIG. 8, the cell includes p-type transistors P21 and P22 and n-type transistors N21 and N22, implementing a 2-input NOR circuit having inputs A and B and an output Y. Note that the cross-sectional structure of the cell will be understandable by referring to FIGS. 2 and 3A-3C shown in the first embodiment.

Interconnects 261, 262, and 263 extending in the X direction are formed in an M1 wiring layer: the interconnect 261 corresponds to the input A, the interconnect 262 corresponds to the input B. and the interconnect 263 corresponds to the output Y.

Nanowires 221a and 221b extending in the X direction are formed in the lower part of the cell, and nanowires 226a and 226b extending in the X direction are formed in the upper part of the cell. A pad 222a doped with a p-type semiconductor is formed on the left of the nanowire 221a as viewed in the figure, and a pad 222b doped with a p-type semiconductor is formed on the right of the nanowire 221b as viewed in the figure. Also, a pad 222c doped with a p-type semiconductor is formed between the nanowires 221a and 221b. A pad 227a doped with an n-type semiconductor is formed on the left of the nanowire 226a as viewed in the figure, and a pad 227b doped with an n-type semiconductor is formed on the right of the nanowire 226b as viewed in the figure. Also, a pad 227c doped with an n-type semiconductor is formed between the nanowires 226a and 226b.

Gate interconnects 231 and 232 extend in the Y direction and also extend in the Z direction over the lower and upper parts of the cell. The gate interconnect 231 is to be the gates of the p-type transistor P21 and the n-type transistor N21, and the gate interconnect 232 is to be the gates of the p-type transistor P22 and the n-type transistor N22. Also, dummy gate interconnects 235a and 235b are formed on both ends of the cell in the X direction. Like the gate interconnects 231 and 232, the dummy gate interconnects 235a and 235b extend in the Y and Z directions.

In the lower part of the cell, local interconnects 241, 242, and 243 are formed to extend in the Y direction. The local interconnect 241 is connected with the pad 222a, the local interconnect 242 is connected with the pad 222b, and the local interconnect 243 is connected with the pad 222c. In the upper part of the cell, local interconnects 244, 245, and 246 are formed to extend in the Y direction. The local interconnect 244 is connected with the pad 227a, the local interconnect 245 is connected with the pad 227b, and the local interconnect 246 is connected with the pad 227c.

The local interconnect 241 extends up to a position overlapping the power supply line 11 as viewed in plan and is connected with the power supply line 11 through a contact 151. The local interconnect 244 extends up to a position overlapping the power supply line 12 as viewed in plan and is connected with the power supply line 12 through a contact 252. The local interconnect 245 extends up to a position overlapping the power supply line 12 as viewed in plan and is connected with the power supply line 12 through a contact 253.

The interconnect 261 is connected with the gate interconnect 231 through a contact 271, and the interconnect 262 is connected with the gate interconnect 232 through a contact 272. The interconnect 263 is connected with the local interconnect 242 through a contact 273 and also connected with the local interconnect 246 through a contact 274.

In the layout structure of the cell in this example, also, the local interconnects have redundant portions unnecessary for constituting the logical function. With these portions, the density unevenness of the local interconnects in the semiconductor integrated circuit device is reduced, and also variations in wiring pattern shapes around the local interconnects are reduced.

Specifically, the local interconnects 243, 244, and 246 extend up to positions overlapping both the power supply lines 11 and 12 as viewed in plan. The local interconnects 243 and 246 overlapping each other as viewed in plan have the same length and are aligned at both ends in the Y direction. Also, the local interconnect 246 extends up to a position overlapping the power supply line 12 as viewed in plan.

That is, the local interconnect 243 is an interconnect that is to be a connection node of the transistors P21 and P22. As is found from the circuit diagram of FIG. 8, the connection node of the transistors P21 and P22 is not connected with any other interconnect. Therefore, the local interconnect 243 does not need to be extended up to positions overlapping the power supply lines 11 and 12 as viewed in plan. In this embodiment, however, the local interconnect 243 is extended upward and downward in the Y direction to overlap the power supply lines 11 and 12 as viewed in plan.

Also, the local interconnect 244 is an interconnect for supplying the power supply voltage VSS to the source of the transistor N21. It is therefore only necessary to form the local interconnect 244 to be connectable with the power supply line 12, and unnecessary to extend it up to a position overlapping the power supply line 11 as viewed in plan. In this example, however, the local interconnect 244 is extended upward in the Y direction to overlap the power supply line 11 as viewed in plan.

Also, the local interconnect 246 is an interconnect for connecting the drains of the transistors N21 and N22 to the output Y. It is therefore only necessary to form the local interconnect 246 to be connectable to the M1 interconnect 263 that is to be the output Y, and unnecessary to extend it up to a position overlapping the power supply line 12 as viewed in plan. In this example, however, the local interconnect 246 is extended downward in the Y direction to overlap the power supply line 12 as viewed in plan.

As described above, according to this example, the local interconnect 243 and the local interconnect 246 extend in the Y direction and overlap each other as viewed in plan. Both the local interconnects 243 and 246 overlap the power supply lines 11 and 12 as viewed in plan. That is, the local interconnects 243 and 246 have redundant portions unnecessary for constituting the logical function. With these portions, the density unevenness of the local interconnects in the semiconductor integrated circuit device is reduced, and also variations in wiring pattern shapes around the local interconnects 243 and 246 are reduced. It is therefore possible to prevent or reduce variations in performance, degradation in reliability, and decrease in yield in the semiconductor integrated circuit and also improve the predictability of the performance of the semiconductor integrated circuit.

Also, the local interconnect 243 that is to be the connection node of the transistors P21 and P22 and is not connected with any other interconnect has a redundant portion. This further reduces the density unevenness of the local interconnects in the semiconductor integrated circuit device and also further reduces variations in wiring pattern shapes around the local interconnect 243.

Note that the local interconnects 243 and 246 overlapping each other as viewed in plan are not necessarily required to have the same length and aligned ends in the Y direction.

Second Embodiment

Figure 9:
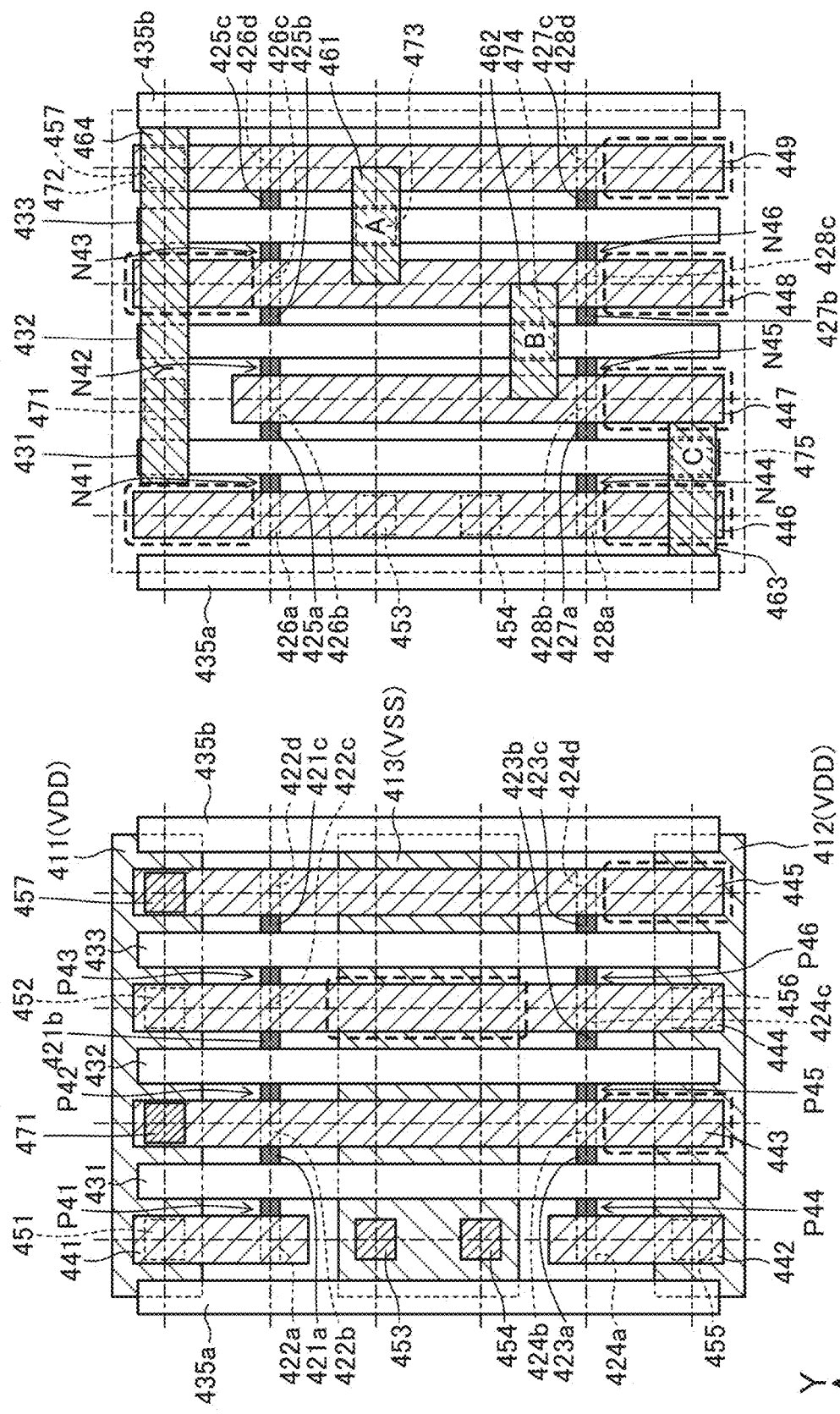
FIGS. 9A and 9B are plan views showing an example of the layout structure of a standard cell according to the second embodiment.
Figure 10:
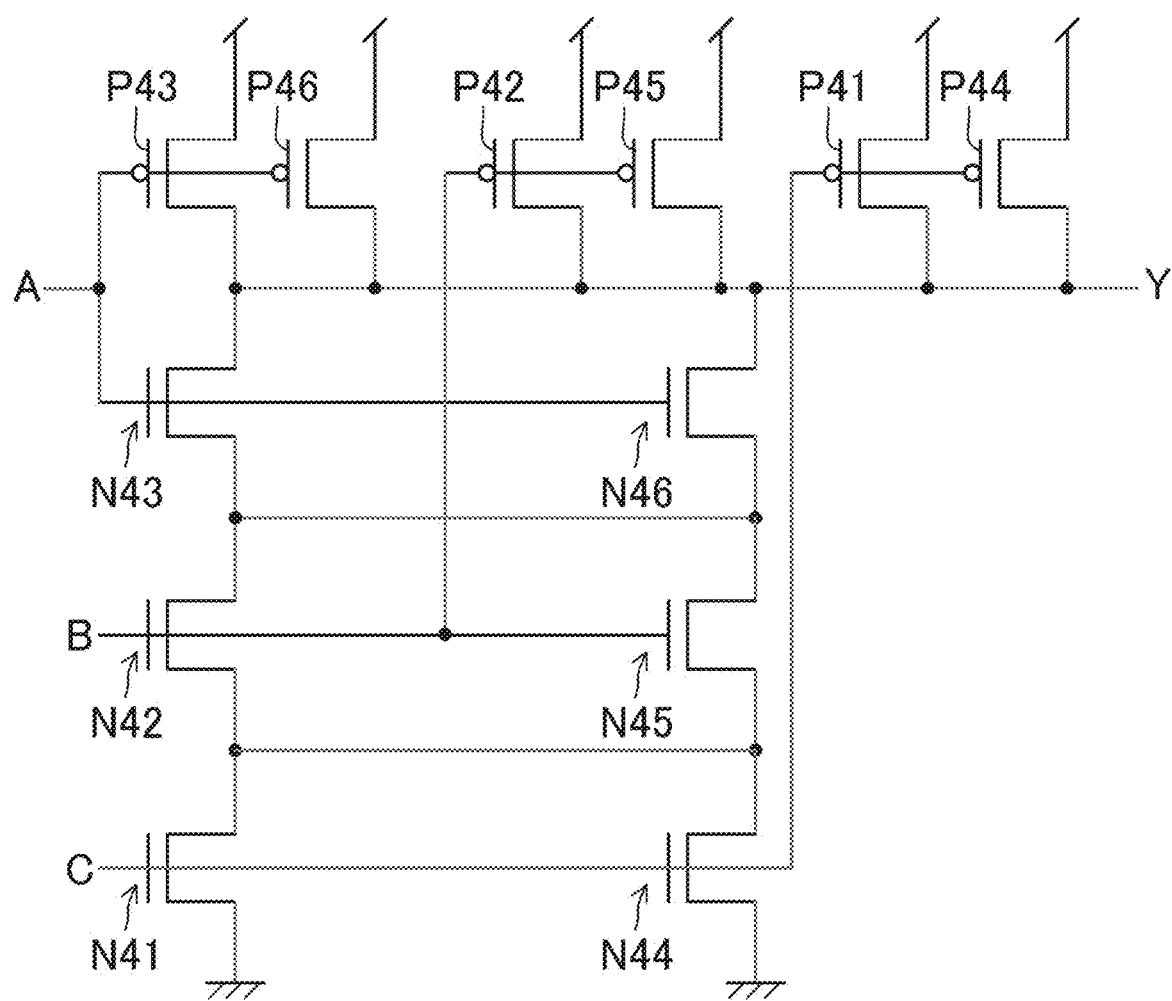
FIG. 10 is a circuit diagram of the standard cell of FIGS. 9A and 9B.

FIGS. 9A and 9B are plan views showing an example of the layout structure of a cell according to the second embodiment, where FIG. 9A shows a lower part including p-type nanowire FETs and FIG. 9B shows an upper part including n-type nanowire FETs. The cell shown in FIGS. 9A and 9B is a so-called double-height cell, having a height double that of the cell shown in the first embodiment (single-height cell). FIG. 10 is a circuit diagram of the cell shown in FIGS. 9A and 9B. As shown in FIG. 10, the cell includes p-type transistors P41, P42, P43, P44, P45, and P46 and n-type transistors N41, N42, N43, N44, N45, and N46, implementing a 3-input NAND circuit having inputs A, B, and C and an output Y. Note that the cross-sectional structure of the cell will be understandable by referring to FIGS. 2 and 3A-3C shown in the first embodiment.

As shown in FIG. 9A, power supply lines 411 and 412 extending in the X direction are provided on both ends of the cell in the Y direction. Also, a power supply line 413 extending in the X direction is formed in the center portion of the cell in the Y direction. The width of the power supply line 413 in the Y direction is roughly double that of the power supply lines 411 and 412. The power supply lines 411, 412, and 413 are all BPRs formed in a buried wiring layer. The power supply lines 411 and 412 supply the power supply voltage VDD and the power supply line 413 supplies the power supply voltage VSS.

Interconnects 461, 462, 463, and 464 extending in the X direction are formed in an M1 wiring layer: the interconnect 461 corresponds to the input A, the interconnect 462 corresponds to the input B, the interconnect 463 corresponds to the input C, and the interconnect 464 corresponds to the output Y.

In a region between the power supply lines 411 and 413, nanowires 421a, 421b, and 421c extending in the X direction are formed in the lower part of the cell, and nanowires 425a, 425b, and 425c extending in the X direction are formed in the upper part of the cell. The nanowires 421a, 421b, and 421c and the nanowires 425a, 425b, and 425c respectively overlap each other as viewed in plan.

A pad 422a doped with a p-type semiconductor is formed on the left of the nanowire 421a as viewed in the figure, a pad 422b doped with a p-type semiconductor is formed between the nanowires 421a and 421b as viewed in the figure, a pad 422c doped with a p-type semiconductor is formed between the nanowires 421b and 421c as viewed in the figure, and a pad 422d doped with a p-type semiconductor is formed on the right of the nanowire 421c as viewed in the figure. The nanowire 421a constitutes the channel portion of the p-type transistor P41, and each of the pads 422a and 422b constitutes a terminal that is to be the source or drain of the p-type transistor P41. The nanowire 421b constitutes the channel portion of the p-type transistor P42, and each of the pads 422b and 422c constitutes a terminal that is to be the source or drain of the p-type transistor P42. The nanowire 421c constitutes the channel portion of the p-type transistor P43, and each of the pads 422c and 422d constitutes a terminal that is to be the source or drain of the p-type transistor P43.

A pad 426a doped with an n-type semiconductor is formed on the left of the nanowire 425a as viewed in the figure, a pad 426b doped with an n-type semiconductor is formed between the nanowires 425a and 425b as viewed in the figure, a pad 426c doped with an n-type semiconductor is formed between the nanowires 425b and 425c as viewed in the figure, and a pad 426d doped with an n-type semiconductor is formed on the right of the nanowire 425c as viewed in the figure. The nanowire 425a constitutes the channel portion of the n-type transistor N41, and each of the pads 426a and 426b constitutes a terminal that is to be the source or drain of the n-type transistor N41. The nanowire 425b constitutes the channel portion of the n-type transistor N42, and each of the pads 426b and 426c constitutes a terminal that is to be the source or drain of the n-type transistor N42. The nanowire 425c constitutes the channel portion of the n-type transistor N43, and each of the pads 426c and 426d constitutes a terminal that is to be the source or drain of the n-type transistor N43.

In a region between the power supply lines 412 and 413, nanowires 423a. 423b, and 423c extending in the X direction are formed in the lower part of the cell, and nanowires 427a, 427b, and 427c extending in the X direction are formed in the upper part of the cell. The nanowires 423a, 423b, and 423c and the nanowires 427a. 427b, and 427c respectively overlap each other as viewed in plan.

A pad 424a doped with a p-type semiconductor is formed on the left of the nanowire 423a as viewed in the figure, a pad 424b doped with a p-type semiconductor is formed between the nanowires 423a and 423b as viewed in the figure, a pad 424c doped with a p-type semiconductor is formed between the nanowires 423b and 423c as viewed in the figure, and a pad 424d doped with a p-type semiconductor is formed on the right of the nanowire 423c as viewed in the figure. The nanowire 423a constitutes the channel portion of the p-type transistor P44, and each of the pads 424a and 424b constitutes a terminal that is to be the source or drain of the p-type transistor P44. The nanowire 423b constitutes the channel portion of the p-type transistor P45, and each of the pads 424b and 424c constitutes a terminal that is to be the source or drain of the p-type transistor P45. The nanowire 423c constitutes the channel portion of the p-type transistor P46, and each of the pads 424c and 424d constitutes a terminal that is to be the source or drain of the p-type transistor P46.

A pad 428a doped with an n-type semiconductor is formed on the left of the nanowire 427a as viewed in the figure, a pad 428b doped with an n-type semiconductor is formed between the nanowires 427a and 427b as viewed in the figure, a pad 428c doped with an n-type semiconductor is formed between the nanowires 427b and 427c as viewed in the figure, and a pad 428d doped with an n-type semiconductor is formed on the right of the nanowire 427c as viewed in the figure. The nanowire 427a constitutes the channel portion of the n-type transistor N44, and each of the pads 428a and 428b constitutes a terminal that is to be the source or drain of the n-type transistor N44. The nanowire 427b constitutes the channel portion of the n-type transistor N45, and each of the pads 428b and 428c constitutes a terminal that is to be the source or drain of the n-type transistor N45. The nanowire 427c constitutes the channel portion of the n-type transistor N46, and each of the pads 428c and 428d constitutes a terminal that is to be the source or drain of the n-type transistor N46.

Gate interconnects 431, 432, and 433 extend in the Y direction and also extend in the Z direction over the lower and upper parts of the cell. The gate interconnects 431, 432, and 433 are formed in a region between the power supply lines 411 and 412. The gate interconnect 431 is to be the gates of the p-type transistors P41 and P44 and the n-type transistors N41 and N44. The gate interconnect 432 is to be the gates of the p-type transistors P42 and P45 and the n-type transistors N42 and N45. The gate interconnect 433 is to be the gates of the p-type transistors P43 and P46 and the n-type transistors N43 and N46. Also, dummy gate interconnects 435a and 435b are formed on both ends of the cell in the X direction. Like the gate interconnects 431, 432, and 433, the dummy gate interconnects 435a and 435b extend in the Y and Z directions.

In the lower part of the cell, local interconnects 441, 442, 443, 444, and 445 are formed to extend in the Y direction. The local interconnect 441 is connected with the pad 422a, the local interconnect 442 is connected with the pad 424a, the local interconnect 443 is connected with the pads 422b and 424b, the local interconnect 444 is connected with the pads 422c and 424c, and the local interconnect 445 is connected with the pads 422d and 424d. In the upper part of the cell, local interconnects 446, 447, 448, and 449 are formed to extend in the Y direction. The local interconnect 446 is connected with the pads 426a and 428a, the local interconnect 447 is connected with the pads 426b and 428b, the local interconnect 448 is connected with the pads 426c and 428c, and the local interconnect 449 is connected with the pads 426d and 428d.

The local interconnect 441 extends up to a position overlapping the power supply line 411 as viewed in plan and is connected with the power supply line 411 through a contact 451. The local interconnect 442 extends up to a position overlapping the power supply line 412 as viewed in plan and is connected with the power supply line 412 through a contact 455. The local interconnect 444 extends up to positions overlapping the power supply lines 411 and 412 as viewed in plan and is connected with the power supply line 411 through a contact 452 and also connected with the power supply line 412 through a contact 456. The local interconnect 446 is connected with the power supply line 413 through contacts 453 and 454.

The local interconnect 445 and the local interconnect 449 are mutually connected through a contact 457.

The interconnect 461 is connected with the gate interconnect 433 through a contact 473. The interconnect 462 is connected with the gate interconnect 432 through a contact 474. The interconnect 463 is connected with the gate interconnect 431 through a contact 475. The interconnect 464 is connected with the local interconnect 443 through a contact 471 and also connected with the local interconnect 449 through a contact 472.

In the layout structure of the cell according to this embodiment, the local interconnects have redundant portions unnecessary for constituting the logical function. With these portions, the density unevenness of the local interconnects in the semiconductor integrated circuit device is reduced, and also variations in wiring pattern shapes around the local interconnects are reduced. In FIGS. 9A and 9B, the redundant portions of the local interconnects are enclosed by the bold broken lines.

Specifically, the local interconnects 446 and 448 further extend upward from the positions of the pads 426a and 426c, respectively, to overlap the power supply line 411 as viewed in plan. The local interconnects 443, 445, 446, 447, 448, and 449 further extend downward from the positions of the pads 424b, 424d, 428a, 428b. 428c, and 428d, respectively, to overlap the power supply line 412 as viewed in plan. Also, the local interconnect 444, which can otherwise be formed as separate interconnects, one connected to the pad 422c and one connected to the pad 424c, is formed as an integral interconnect in this embodiment, having an overlap with the power supply line 413 as viewed in plan.

As a result, the local interconnects 443, 444, 445, 446, 448, and 449 overlap the power supply lines 411, 412, and 413 as viewed in plan. The local interconnects 443, 445, 448, and 449 are electrically isolated from any of the power supply lines 411, 412, and 413. The local interconnects 444 and 448 overlapping each other as viewed in plan have the same length and are aligned at both ends in the Y direction. The local interconnects 445 and 449 overlapping each other as viewed in plan, which are mutually connected through the contact 457, have the same length and are aligned at both ends in the Y direction.

As described above, according to this embodiment, the local interconnects 441 and 442 overlap the local interconnect 446 as viewed in plan, and the local interconnect 446 overlaps the power supply lines 411, 412, and 413 as viewed in plan. The local interconnect 443 and the local interconnect 447 overlap each other as viewed in plan, and the local interconnect 443 overlaps the power supply lines 411, 412, and 413 as viewed in plan. The local interconnect 444 and the local interconnect 448 overlap each other as viewed in plan, and both the local interconnects 444 and 448 overlap the power supply lines 411, 412, and 413 as viewed in plan. The local interconnect 445 and the local interconnect 449 overlap each other as viewed in plan, and both the local interconnects 445 and 449 overlap the power supply lines 411, 412, and 413 as viewed in plan. That is, the local interconnects 443, 444, 445, 446, 448, and 449 have redundant portions unnecessary for constituting the logical function. With these portions, the density unevenness of the local interconnects in the semiconductor integrated circuit device is reduced, and also variations in wiring pattern shapes around the local interconnects 443, 444, 445, 446, 448, and 449 are reduced. It is therefore possible to prevent or reduce variations in performance, degradation in reliability, and decrease in yield in the semiconductor integrated circuit and also improve the predictability of the performance of the semiconductor integrated circuit.

(Other Example)

The cell according to this embodiment may be configured so that the lower part includes n-type FETs and the upper part includes p-type FETs. In this case, power supply lines for supply of VSS may be provided on both ends of the cell in the Y direction while a power supply line for supply of VDD being provided in the center portion of the cell in the Y direction, and a layout similar to that described above may be used.

(Layout Example of Circuit Block)

Figure 11:
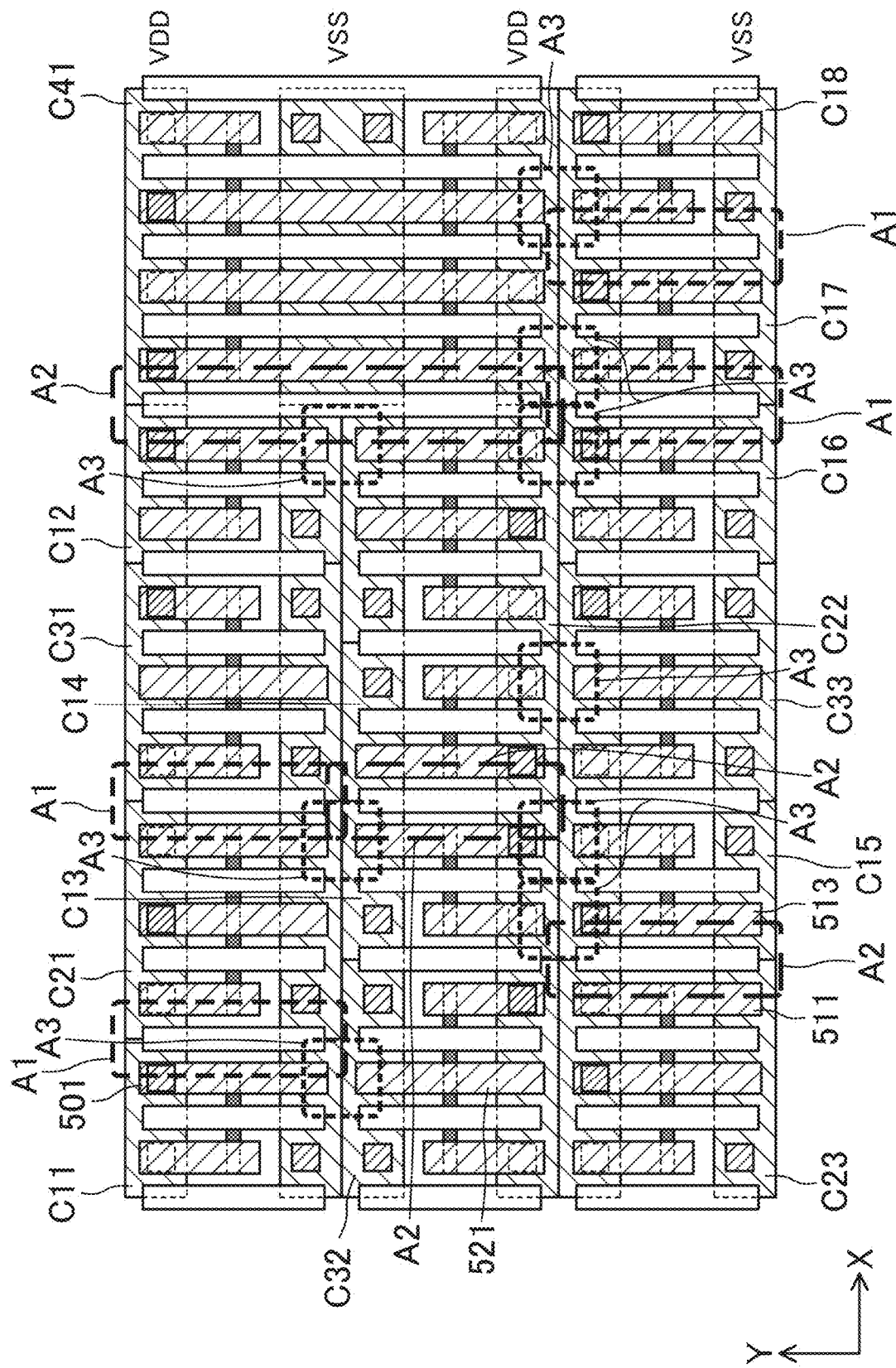
FIG. 11 shows an example of the layout of a circuit block using the standard cells described in the embodiments.
Figure 12:
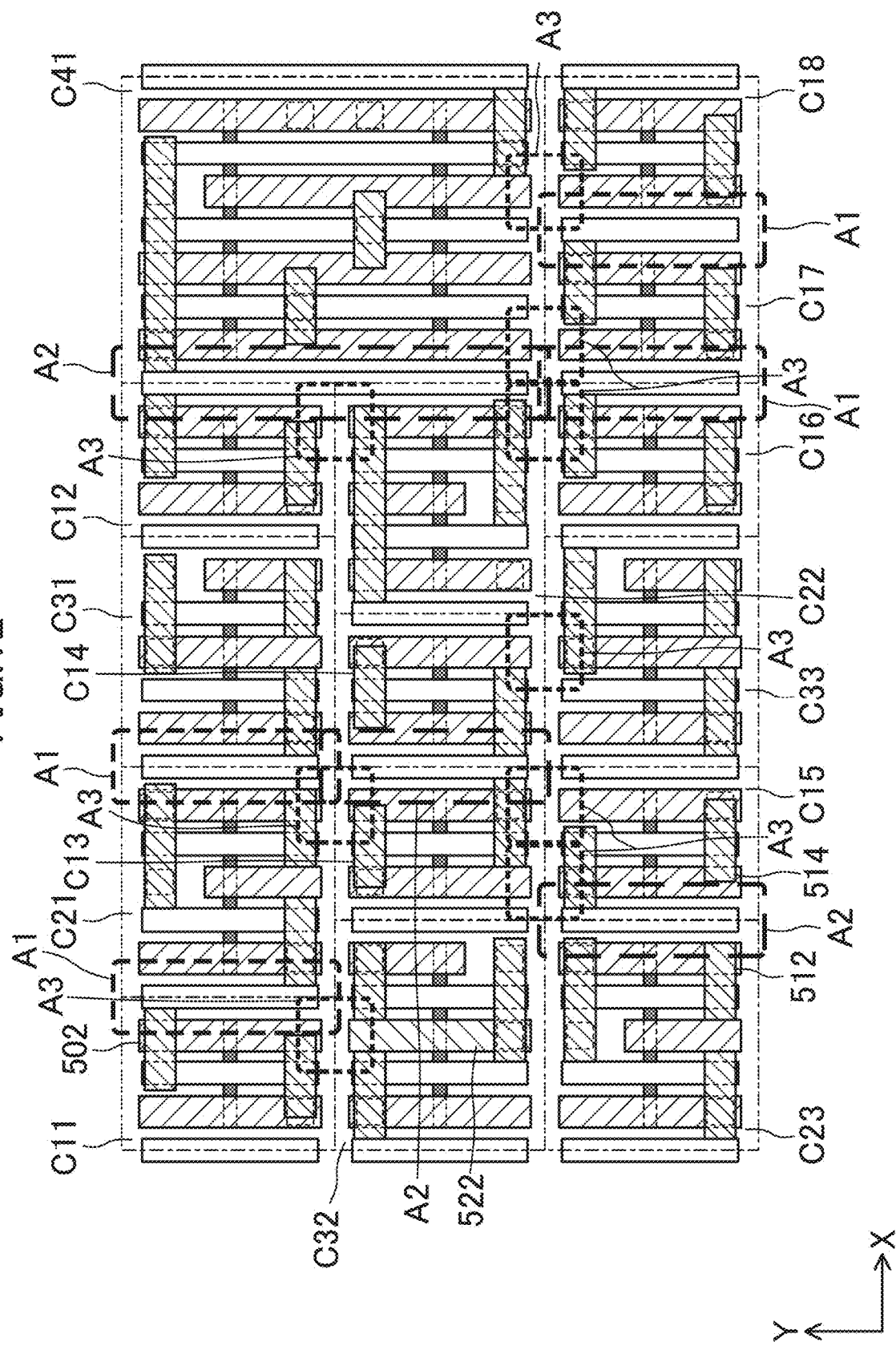
FIG. 12 shows an example of the layout of a circuit block using the standard cells described in the embodiments.

FIGS. 11 and 12 show an example of the layout of a circuit block using the cells described in the above embodiments. FIG. 11 shows the lower part of the cells, and FIG. 12 shows the upper part of the cells. Cells C11, C12, C13, C14, C15, C16, C17, and C18 are inverter cells described in the first embodiment, cells C21, C22, and C23 are 2-input NAND cells described in the first embodiment, cells C31, C32, and C33 are 2-input NOR cells described in the first embodiment, and a cell C41 is a double-height 3-input NAND cell described in the second embodiment. The double-height 3-input NAND cell C41 and the inverter cell C15 are inverted in the X direction. The 2-input NOR cell C32, the inverter cell C13, and the 2-input NAND cell C22 are inverted in the Y direction. The inverter cell C14 is inverted in the X and Y directions.

In the layout of FIGS. 11 and 12, areas A1, A2, and A3 enclosed by the broken lines represent the features according to the present disclosure. In areas A1, in one of two cells adjacent in the X direction, a local interconnect closest to the cell boundary has a redundant portion. This enhances the predictability of the finished dimensions of the pattern of the other cell, improving the predictability of the performance of the semiconductor integrated circuit. For example, in area A1 where the inverter cell 11 on the left end of the top row and the 2-input NAND cell C21 are adjacent to each other, local interconnects 501 and 502 near the right end of the inverter cell C11 have redundant portions. That is, in the inverter cell C11 and the 2-input NAND cell C21, their p-type transistors face each other, and their n-type transistors face each other, across the cell boundary. In the inverter cell C11, the local interconnect 501 is connected to the source or drain of the p-type transistor whichever is closer to the cell boundary, and the local interconnect 502 is connected to the source or drain of the n-type transistor whichever is closer to the cell boundary. The local interconnects 501 and 502 overlap each other as viewed in plan, and also overlap both the power supply line for supply of VDD and the power supply line for supply of VSS as viewed in plan. This enhances the predictability of the finished dimensions of the pattern of the 2-input NAND cell C21, improving the predictability of the performance of the semiconductor integrated circuit and also reducing variations in wiring pattern shapes.

In areas A2, in both of two cells adjacent in the X direction, local interconnects closest to the cell boundary have redundant portions. This enhances the predictability of the finished dimensions of the patterns of both cells, improving the predictability of the performance of the semiconductor integrated circuit and also reducing variations in wiring pattern shapes. For example, in area A2 where the 2-input NAND cell C23 on the left end of the bottom row and the inverter cell C15 are adjacent to each other, local interconnects 511 and 512 near the right end of the 2-input NAND cell C23 and local interconnects 513 and 514 near the left end of the inverter cell C15 have redundant portions. This enhances the predictability of the finished dimensions of the patterns of the 2-input NAND cell C23 and the inverter cell C15, improving the predictability of the performance of the semiconductor integrated circuit and also reducing variations in wiring pattern shapes.

In areas A3, in one or both of two cells adjacent in the Y direction, a local interconnect has a redundant portion in its part closer to the cell boundary. This enhances the predictability of the finished dimensions of the pattern of one or both cells, improving the predictability of the performance of the semiconductor integrated circuit and also reducing variations in wiring pattern shapes. For example, in area A3 where the inverter cell C11 on the left end of the top row and the 2-input NOR cell C32 on the left end of the middle row are adjacent to each other, the local interconnects 511 and 512 of the inverter cell C11 have redundant portions in their lower parts in the Y direction and local interconnects 521 and 522 of the 2-input NOR cell C32 have redundant portions in their upper parts in the Y direction. This enhances the predictability of the finished dimensions of the patterns of the inverter cell C11 and the 2-input NOR cell C32, improving the predictability of the performance of the semiconductor integrated circuit and also reducing variations in wiring pattern shapes.

In the embodiments described above, while each transistor is assumed to have one nanowire, some or all transistors may have a plurality of nanowires. In this case, a plurality of nanowires may be arranged in the Y direction as viewed in plan, or arranged in the Z direction. Otherwise, a plurality of nanowires may be arranged in both the Y direction and the Z direction. The number of nanowires included in each transistor may be different between the upper and lower parts of the cell.

Also, in the above embodiments, while the cross-sectional shape of the nanowires is roughly square, it is not limited to this. For example, the shape may be circular or rectangular.

While the above embodiments have been described taking nanowire FETs as an example of three-dimensional transistors, the transistor type is not limited to this. For example, fin transistors may be used as the transistors formed in the lower part of the cell.

According to the present disclosure, in a semiconductor integrated circuit device provided with a standard cell using a CFET, it is possible to prevent or reduce variations in performance, degradation in reliability, and decrease in yield and also improve the predictability of the performance. The present disclosure is therefore useful for improvement of the performance of a semiconductor chip, for example.

What is claimed is:

1. A semiconductor integrated circuit device including a first standard cell and a second standard cell placed adjacent to the first standard cell in a first direction, the first standard cell comprising:
   a first power supply line extending in the first direction and supplying a first power supply voltage;
   a second power supply line extending in the first direction, arranged spaced apart from the first power supply line in a second direction perpendicular to the first direction, and supplying a second power supply voltage different from the first power supply voltage;
   a first transistor that is a three-dimensional transistor of a first conductivity type lying between the first power supply line and the second power supply line as viewed in a depth direction in plan, the depth direction being perpendicular to the first direction and the second direction; and
   a second transistor that is a three-dimensional transistor of a second conductivity type, formed above the first transistor in the depth direction, lying between the first power supply line and the second power supply line as viewed in the depth direction in plan, the second standard cell comprising:
   a third power supply line extending in the first direction and supplying the first power supply voltage;
   a fourth power supply line extending in the first direction and supplying the second power supply voltage;
   a third transistor that is a three-dimensional transistor of the first conductivity type lying between the third power supply line and the fourth power supply line as viewed in the depth direction in plan; and
   a fourth transistor that is a three-dimensional transistor of the second conductivity type, formed above the third transistor in the depth direction, lying between the third power supply line and the fourth power supply line as viewed in the depth direction in plan, wherein:
   the first transistor and the third transistor face each other, and the second transistor and the fourth transistor face each other, across a cell boundary that is a boundary between the first standard cell and the second standard cell,
   the first standard cell further comprises:
      a first local interconnect extending in the second direction, connected with a source or drain of the first transistor whichever is closer to the cell boundary; and
      a second local interconnect extending in the second direction and overlapping the first local interconnect as viewed in the depth direction in plan, connected with a source or drain of the second transistor whichever is closer to the cell boundary, and
   the first local interconnect overlaps the first and second power supply lines as viewed in the depth direction in plan, and the second local interconnect overlaps the first and second power supply lines as viewed in the depth direction in plan.

* * * * *